United States Patent
Hirata et al.

(10) Patent No.: US 6,504,139 B1
(45) Date of Patent: Jan. 7, 2003

(54) SUBSTRATE FOR PHOTOELECTRIC CONVERSION DEVICE, METHOD OF MANUFACTURING THE SAME, AND PHOTOELECTRIC CONVERSION DEVICE USING THE SAME

(75) Inventors: Masahiro Hirata, Osaka (JP); Tsuyoshi Otani, Osaka (JP); Akira Fujisawa, Osaka (JP); Hodaka Norimatsu, Osaka (JP)

(73) Assignees: Nippon Sheet Glass Co., Ltd., Osaka (JP); Kaneka Corporation, Osaka (JP)

( * ) Notice: Subject to any disclaimer, the term of this patent is extended or adjusted under 35 U.S.C. 154(b) by 0 days.

(21) Appl. No.: 09/579,757

(22) Filed: May 26, 2000

(30) Foreign Application Priority Data

May 28, 1999 (JP) .............................. 11-149710
Mar. 22, 2000 (JP) ........................ 2000-080960

(51) Int. Cl.$^7$ ................................................ H01J 40/14
(52) U.S. Cl. .............................. 250/214 R; 250/214.1; 257/436
(58) Field of Search .......................... 250/214 R, 214.1; 438/57; 257/53, 436, 431, 276; 136/246, 249, 255, 259, 256, 258

(56) References Cited

U.S. PATENT DOCUMENTS

| | | | |
|---|---|---|---|
| 4,532,537 A | 7/1985 | Kane | 257/458 |
| 4,689,438 A | 8/1987 | Fukatsu et al. | 136/256 |
| 4,805,296 A | 2/1989 | Jinda et al. | 29/620 |
| 4,808,462 A | * 2/1989 | Yaba et al. | 428/142 |
| 5,401,305 A | 3/1995 | Russo et al. | 106/287.1 |

FOREIGN PATENT DOCUMENTS

| | | |
|---|---|---|
| EP | 0 0305 928 | 3/1989 |
| EP | 0 436 741 | 7/1991 |
| JP | 60-175465 | 9/1985 |
| JP | 62-44573 | 2/1987 |

OTHER PUBLICATIONS

European Search Report for application No. 00111430.5–2203.

* cited by examiner

*Primary Examiner*—Frank G. Font
*Assistant Examiner*—Thanh X. Luu
(74) *Attorney, Agent, or Firm*—Merchant & Gould P.C.

(57) ABSTRACT

A substrate for a photoelectric conversion device that is effective in trapping light in a photovoltaic layer and can be manufactured by industrial mass-production, a method of manufacturing the same, and a photoelectric conversion device using the same. On a glass sheet containing an alkaline component, a first undercoating film containing tin oxide as a main component, a second undercoating film, and a conductive film containing tin oxide as a main component are formed in this order, thus obtaining a substrate. The first undercoating film is formed by a thermal decomposition oxidation reaction of coating-film forming materials containing chlorine on glass with a temperature of at least 600° C. In the first undercoating film, holes are formed without an after-treatment. The surface of the conductive film above the holes has larger irregularities, thus scattering incident light on a photovoltaic unit. Further, on the photovoltaic unit, a back electrode is formed, thus obtaining a photoelectric conversion device.

12 Claims, 3 Drawing Sheets

SUBSTRATE FOR PHOTOELECTRIC CONVERSION DEVICE, METHOD OF MANUFACTURING THE SAME, AND PHOTOELECTRIC CONVERSION DEVICE USING THE SAME

FIELD OF THE INVENTION

The present invention relates to a substrate for a photoelectric conversion device and a method of manufacturing the same, and further to a photoelectric conversion device using this substrate.

BACKGROUND OF THE INVENTION

In a thin film photoelectric conversion device, a transparent conductor on which a transparent conductive film of tin oxide, ITO, or the like is formed on a glass surface is used as a substrate. As the transparent conductive film, a film containing tin oxide as a main component has been used in many cases. A thin film photoelectric conversion device using thin film silicon as a photovoltaic material has been receiving attention due to the low energy cost required for its manufacture or the like.

Generally, a thin film silicon-based photoelectric conversion device includes an undercoating film, a transparent conductive film, thin film silicon, and a metal film, which are formed sequentially on the surface of a glass sheet. As the transparent conductive film, a tin oxide film has been used in many cases, which is formed by a method accompanied by a pyrolytic oxidation reaction of raw materials, such as a CVD method or the like. The undercoating film is provided for preventing an alkaline component such as sodium or the like contained in the glass sheet from diffusing into the transparent conductive film, thus preventing a decrease in electrical characteristics (i.e. the increase in resistance) of the transparent conductive film. As the undercoating film, a transparent thin film such as a silicon oxide film or the like is used.

The transparent conductive film of the thin film photoelectric conversion device is required to have a high transmittance (i.e. to introduce a larger quantity of light into a photovoltaic layer) and a low resistance (i.e. to reduce the loss in leading out generated electricity). It has been known that to provide the surface of the transparent conductive film with proper roughness is effective in trapping light in the photovoltaic layer. Therefore, in a substrate for a thin film photoelectric conversion device, it is required that the transmittance is high and a haze ratio reflecting the surface roughness also is high to some degree.

Methods for providing the surface of the transparent conductive film with roughness include, a method of forming the surface of an undercoating film to have roughness. As a method of manufacturing a silicon oxide film having a surface with roughness, for instance, JP 60-175465 A discloses a method using a processing liquid obtained by adding boric acid to an aqueous solution of hexafluorosilicic acid saturated with silicon oxide. Further, JP 62-44573 A discloses a method using gaseous molecules containing silicon atoms and an oxidizing gas. In both these methods, silicon oxide particles produced in the reactions are allowed to be contained in a silicon oxide coating film.

However, the above-mentioned conventional methods have not enabled a substrate for a photoelectric conversion device effective for the light trapping in a photovoltaic layer to be manufactured by industrial mass-production. Since the silicon oxide film having a surface with roughness is formed by allowing silicon oxide particles produced in the reactions to be contained in the silicon oxide coating film, a film formation reaction and a particle production reaction must be controlled simultaneously. Therefore, it is difficult to carry out stable manufacturing continuously.

SUMMARY OF THE INVENTION

The present invention is intended to provide a substrate for a photoelectric conversion device, such as a photovoltaic device, that is effective for light trapping in a photoelectric conversion layer and can be manufactured by industrial mass-production, and a method of manufacturing the same. Further, the present invention is intended to improve photoelectric conversion characteristics of a photoelectric conversion device by using this substrate.

In order to achieve the aforementioned objects, a substrate for a photoelectric conversion device according to the present invention includes a first undercoating film containing, as a main component, at least one selected from tin oxide, titanium oxide, indium oxide, and zinc oxide, a second undercoating film, and a conductive film, which are formed on a glass sheet containing an alkaline component in this order. In the first undercoating film, holes are formed.

According to the above-mentioned configuration, a substrate can be provided that is suitable for a thin film photoelectric conversion device and can be manufactured by industrial mass-production.

In the substrate for a photoelectric conversion device, it is preferable that the first undercoating film has at least two holes per square micron. Further, in the substrate for a photoelectric conversion device, it is preferable that the first undercoating film has a thickness in the range between 10 nm and 100 nm. In the substrate for a photoelectric conversion device, it also is preferable that the glass sheet is a float glass sheet obtained by a float glass process and the first undercoating film, the second undercoating film, and the conductive film are formed on the top surface of the float glass sheet. In this case, the top surface denotes the surface opposite to the surface (the bottom surface) in contact with molten tin in a float bath during the formation by the float glass process.

In order to achieve the above-mentioned object, a method of manufacturing a substrate for a photoelectric conversion device according to the present invention includes forming a first undercoating film, a second undercoating film, and a conductive film in this order on a glass sheet containing an alkaline component, or on a glass ribbon in a manufacturing process of the glass sheet. In the method, the first undercoating film is formed to include holes by a pyrolytic oxidation reaction of a coating-film forming material containing chlorine on the glass sheet or the glass ribbon having a temperature of at least 600° C.

In the manufacturing method, it is surmised that sodium chloride produced in the first undercoating film by the reaction between sodium in the glass sheet and chlorine in the material is lost from the film to form the holes in the first undercoating film. Thus, a substrate suitable for a thin film photoelectric conversion device can be manufactured by industrial mass-production.

The present invention also provides a photoelectric conversion device using the above-mentioned substrate. In this photoelectric conversion device, at least one photoelectric conversion unit and a back electrode are stacked on the conductive film of the substrate for a photoelectric conversion device in this order. This photoelectric conversion device is used with its glass sheet side positioned as the light incident side.

DETAILED DESCRIPTION OF THE INVENTION

Preferable embodiments of the substrate for a photoelectric conversion element and the method of manufacturing the same according to the present invention are described as follows.

Figure 1:
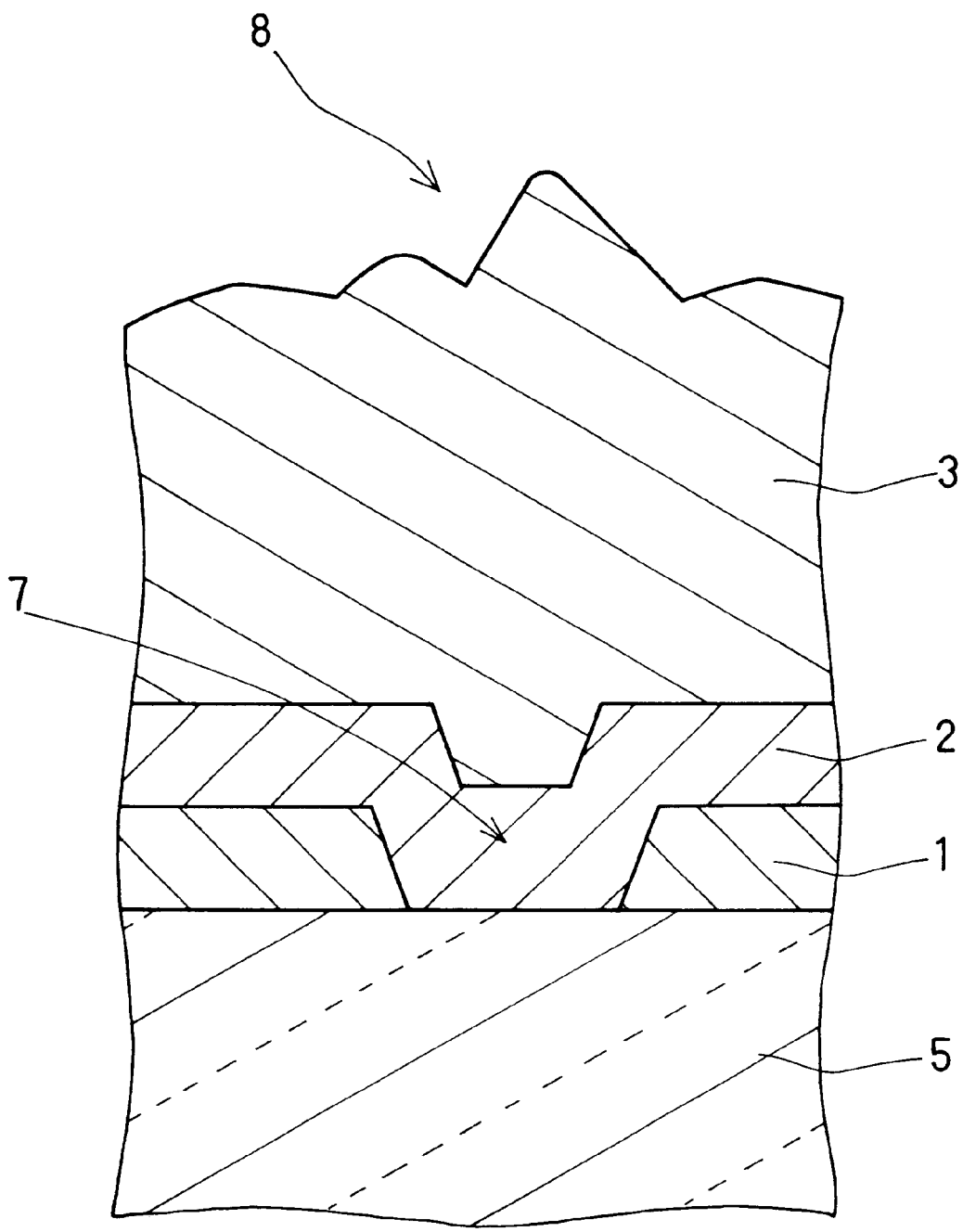
FIG. 1 is a sectional view of an embodiment of a substrate for a photoelectric conversion device according to the present invention.

FIG. 1 is a sectional view of an embodiment of the substrate for a photoelectric conversion device according to the present invention. In the substrate for a photoelectric conversion device of the present invention, a first undercoating film 1, a second undercoating film 2, and a conductive film 3 are formed on a glass sheet 5 in this order. In the first undercoating film 1, a hole (through hole) 7 that passes through the film 1 is formed. The second undercoating film 2 enters into the hole 7 to cover a step portion formed by the hole 7, thus forming irregularities at the surface of the second undercoating film 2. Further, on the region of the second undercoating film 2 where the irregularities have been formed, irregularities 8 also appear at the surface of the conductive film 3. This is because the surface irregularities of the second undercoating film 2 function as a growth nucleus when the conductive film is formed. Irregularities also are provided in the other regions at the surface of the conductive film 3 having a crystalline property and preferably containing tin oxide as the main component. In the region above the hole 7, however, relatively large surface irregularities 8 are formed and contribute to the improvement in the light trapping effect in a photovoltaic layer.

Since the second undercoating film 2 is formed, the conductive film 3 is not in contact with the glass sheet 5 even at the hole 7. The second undercoating film 2 is formed to cover the through hole and suppresses the diffusion of the alkaline component from the glass sheet 5 into the conductive film 3 over the entire surface of the glass sheet.

It is preferable that the first undercoating film 1 contains tin oxide, titanium oxide, indium oxide, or zinc oxide as the main component. In this specification, the "main component" denotes a component accounting for at least 50 wt. % of the whole amount. In the first undercoating film 1, fluorine, chlorine, or other trace components may be contained. Further, the first undercoating film 1 may contain other metallic elements as trace components and may be a film formed of, for example, tin oxide containing silicon. In addition, it is preferable that the conductive film 3 contains tin oxide as the main component. As the conductive film 3, a tin oxide film in which fluorine or the like is added is particularly suitable for improving the conductivity. The amount of elements to be added is not particularly limited. However, when fluorine is to be added, its suitable amount is 0.05 wt. % to 1 wt. %.

The second undercoating film 2 is not particularly limited. However, it is preferable that the second undercoating film 2 contains one of or both of silicon oxide and aluminum oxide as a main component. As the second undercoating film 2, a silicon oxide film is particularly suitable. Other preferable examples of the undercoating film include films containing an oxycarbide or oxynitride of the above-mentioned metals such as SiOC as the main component.

Preferable thicknesses of the respective films are, for example:

the first undercoating film: between 10 nm and 100 nm
the second undercoating film: between 10 nm and 100 nm
the conductive film: between 500 nm and 1200 nm.

It is preferable that the mean density of the holes present in the first undercoating film is at least 2 holes/$\mu m^2$ to obtain large surface irregularities of the conductive film. However, when the mean density of the holes increases, the size of the holes tends to be reduced. The smaller size of the hole limits the size of the surface irregularities of the conductive film. Therefore, it is preferable that the mean density of the holes is 8 holes/$\mu m^2$ or less, particularly 6 holes/$\mu m^2$ or less. In addition, it is preferable that the holes go through the first undercoating film (i.e. the holes are through holes). The density and state of the holes can be confirmed easily by observing those using a transmission electron microscope.

The size of the surface irregularities of the transparent conductive film can be indicated by a haze ratio of the substrate for a photoelectric conversion device. The larger the size of the irregularities is, the higher the haze ratio becomes. The haze ratio is measured by a method of measuring a haze value, which is described in the test method of the optical characteristics of plastic (JIS K7105-1981).

As the glass sheet, one containing an alkaline component such as a soda-lime glass sheet may be used.

Preferable embodiments of the method of manufacturing a substrate for a photoelectric conversion device according to the present invention include a method of depositing the above-mentioned respective films sequentially on the top surface of a glass ribbon by utilizing the heat of the glass ribbon in a float glass manufacturing process. As the method of forming films by utilizing the heat of a glass ribbon, a spray method in which a raw material liquid is atomized and then supplied on a glass ribbon surface or a CVD method in which a raw material is evaporated and then supplied on a glass ribbon surface can be used. It is preferred to use a chlorine containing raw material when forming the first undercoating film.

Figure 2:
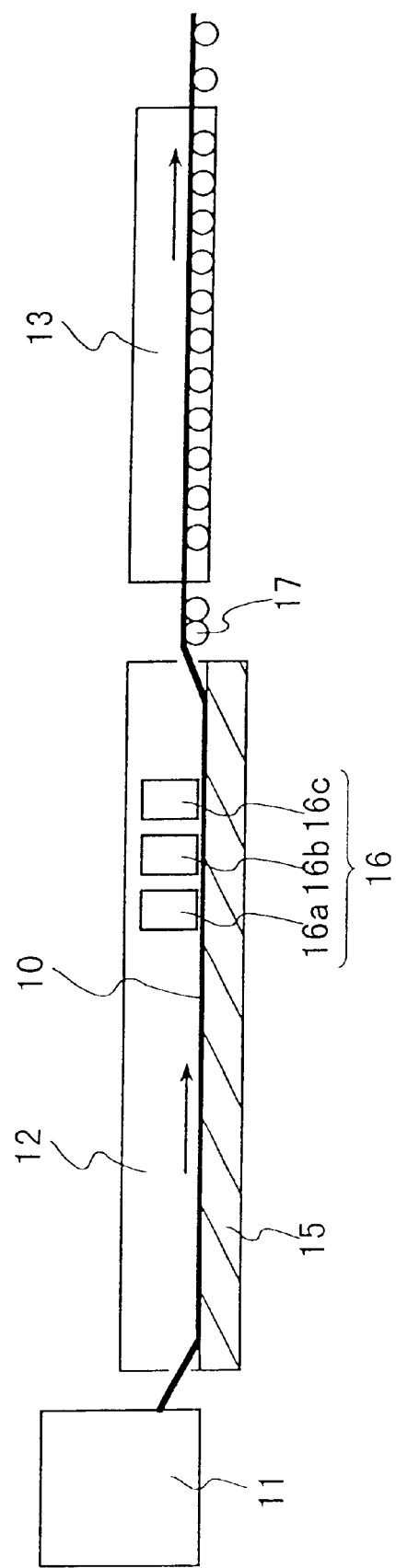
FIG. 2 is a view showing a configuration of a device used for manufacturing a substrate for a photoelectric conversion device according to the present invention.

FIG. 2 shows an embodiment of a device for depositing a thin film on a glass ribbon surface by the CVD method in a float glass process. As shown in FIG. 2, in this device, a predetermined number of coaters 16 (three coaters 16a, 16b, and 16c in the embodiment shown in the figure) are placed directly above a glass ribbon 10. The glass ribbon 10 is formed from molten glass, which is poured from a furnace 11 into a float bath 12, in a belt-like form on a tin bath 15 while traversing the length of the float bath 12. The number and arrangement of the coaters are selected suitably depending on the kind and thickness of the coating film to be formed. These coaters supply materials, which have been prepared and evaporated, to form coating films on the glass ribbon 10 surface (top surface) continuously. By supplying different materials from the respective coaters, the first undercoating film, the second undercoating film, and the conductive film can be stacked successively. The temperature of the glass ribbon 10 is controlled by a heater and a cooler (not shown in the figure) installed inside the float bath 12 so that the glass ribbon 10 has a predetermined temperature directly before reaching the coater 16.

In this case, it is preferable that the predetermined temperature of the glass ribbon is in the range between 600° C.

and 750° C., particularly between 630° C. and 750° C. The temperature of the glass ribbon 10 can be measured with a radiation thermometer. The glass ribbon 10 with the coating films thus formed is lifted by a roller 17 and then is annealed in an annealing furnace 13.

In the case of forming thin films containing tin oxide as the main component by the CVD method, examples of the tin material to be used include monobutyltin trichloride (MBTC), tin tetrachloride, dimethyltin dichloride, dibutyltin dichloride, dioctyltin dichloride, tetramethyltin, or the like. When the first undercoating film is formed, an organic tin chloride such as monobutyltin trichloride (MBTC) or dimethyltin dichloride (DMT) including chlorine in a tin compound, or the like is used suitably. Oxidation materials include oxygen, water vapor, dry air, or the like. Examples of the fluorine material used when fluorine is added to the conductive film include hydrogen fluoride, trifluoroacetic acid, bromotrifluoromethane, chlorodifluoromethane, or the like.

When a film containing titanium oxide, indium oxide, zinc oxide, or the like as the main component is formed as the first undercoating film, the film may be formed using a chlorine containing material such as metal chloride (for example, titanium tetrachloride or zinc dichloride) by the CVD method as in the above.

In the case where a thin film containing silicon oxide as the main component is formed by the CVD method, examples of the silicon material to be used include silane (monosilane), disilane, trisilane, monochlorosilane, 1,2-dimethylsilane, 1,1,2-trimethyldisilane, 1,1,2,2-tetramethyl disilane, tetramethyl orthosilicate, tetraethyl orthosilicate, or the like. In this case, oxidation materials include oxygen, water vapor, dry air, carbon dioxide, carbon monoxide, nitrogen dioxide, ozone, or the like. When a material with extremely high reactivity such as monosilane or the like is used, an unsaturated hydrocarbon gas such as ethylene, acetylene, toluene, or the like may be added to control the reactivity.

Besides the silicon oxide, examples of the aluminum material to be used when a film containing aluminum oxide as the main component, which is suitable as the second undercoating film, is formed by the CVD method include trimethylaluminum, aluminum triisopropoxide, diethylaluminum chloride, aluminum acetylacetonate, aluminum chloride, or the like. In this case, oxygen, water vapor, dry air, or the like can be used as an oxidation material.

Figure 3:
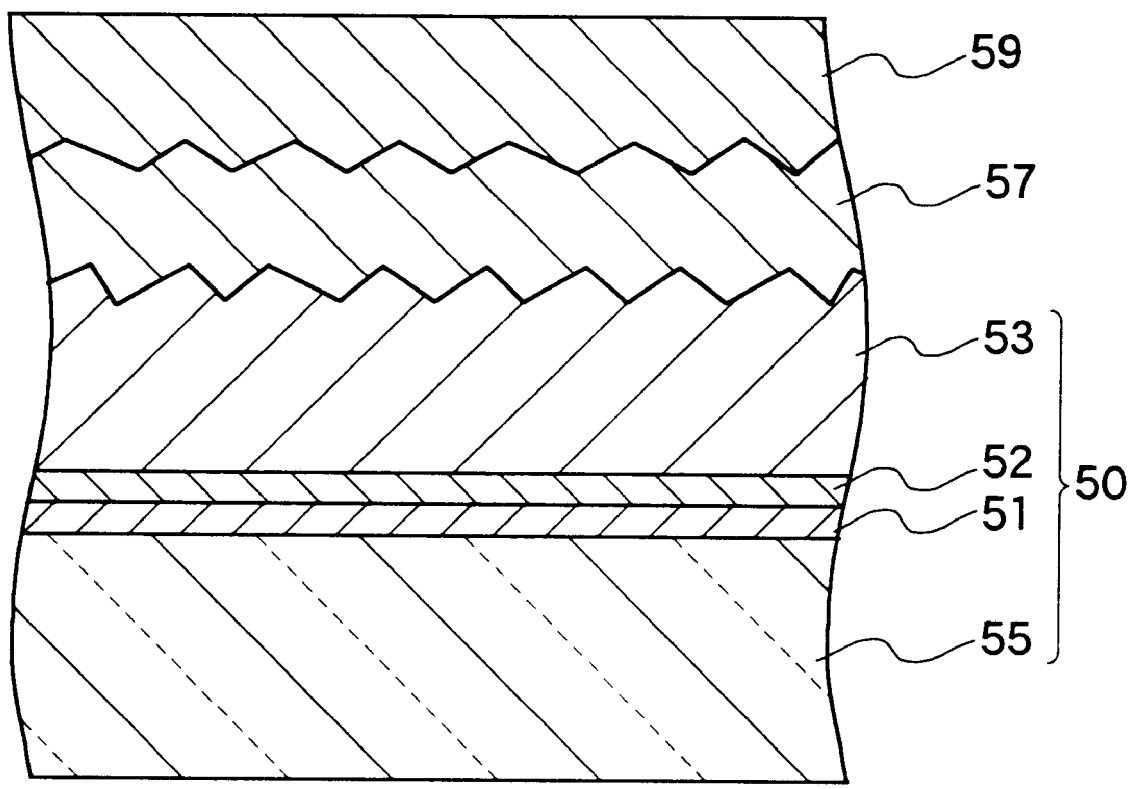
FIG. 3 is a sectional view of an embodiment of a photoelectric conversion device according to the present invention.

FIG. 3 shows a sectional view of an embodiment of a thin film photoelectric conversion device (a thin film silicon-based photoelectric conversion device) using the substrate according to the present invention.

In this thin film silicon-based photoelectric conversion device, on a substrate 50 for a photoelectric conversion device in which a first and a second undercoating layers 51 and 52 and a conductive film 53 are formed on a glass sheet 55 in this order, a photovoltaic unit 57 is formed and further a back electrode 59 is formed thereon.

The photovoltaic unit may be formed of a single layer as shown in the figure, but also may be formed of a plurality of layers. Examples of the photovoltaic unit include a unit in which an amorphous silicon-based thin film or a crystalline silicon-based thin film is used as a photovoltaic layer (hereinafter the respective units are indicated by referring to the kind of the photovoltaic layer, such as "an amorphous silicon-based thin film photovoltaic unit" and "a crystalline silicon-based thin film photovoltaic unit").

An amorphous silicon-based thin film photovoltaic unit is formed by depositing respective p-type, i-type, and n-type semiconductor layers in this order by a plasma CVD method. Specifically, for example, it may be formed by depositing a p-type microcrystalline silicon-based layer doped with at least 0.01 atom % boron as an impurity atom determining its conductive type, an intrinsic amorphous silicon layer to be a photovoltaic layer, and an n-type microcrystalline silicon-based layer doped with at least 0.01 atom % phosphorus as an impurity atom determining its conductive type in this order. However, these respective layers are not limited to those mentioned above. For instance, the impurity atom in the p-type microcrystalline silicon-based layer may be aluminum or the like, and an amorphous silicon-based layer may be used as the p-type layer. For the p-type layer, an alloy material of amorphous or microcrystalline silicon carbide, silicon germanium, or the like may be used.

It is preferable that the conductive type (p-type and n-type) microcrystalline silicon-based layers have a thickness in the range between 3 nm and 100 nm, further preferably between 5 nm and 50 nm.

It is preferable that the intrinsic amorphous silicon layer is formed by the plasma CVD method while the temperature of an undercoating is set to be 450° C. or lower. This layer is formed as a thin film of substantially an intrinsic semiconductor, with a density of impurity atoms determining its conductive type of $1 \times 10^{18}$ cm$^{-3}$ or lower. It is preferable that the intrinsic amorphous silicon layer has a thickness in the range between 0.05 $\mu$m and 0.5 $\mu$m. However, in an amorphous silicon-based thin film photovoltaic unit, an amorphous silicon carbide layer (for instance, an amorphous silicon carbide layer formed of amorphous silicon containing 10 atom % carbon or less) or an amorphous silicon germanium layer (for example, an amorphous silicon germanium layer formed of amorphous silicon containing 30 atom % germanium or less) of an alloy material may be formed instead of the intrinsic amorphous silicon layer.

Similarly, a crystalline silicon-based thin film photovoltaic unit can be formed by depositing respective p-type, i-type, and n-type semiconductor layers in this order by the plasma CVD method following the same procedure as that used for the amorphous silicon-based thin film photovoltaic unit.

It is preferable that as the back electrode, at least one metallic layer formed of at least one material selected from Al, Ag, Au, Cu, Pt, and Cr is formed by sputtering or vapor deposition. In addition, a layer formed of conductive oxide such as ITO, $SnO_2$, ZnO, or the like may be formed between the photovoltaic unit and the metal electrode.

In the present specification, a material with a crystalline fraction in volume of at least 50% is taken as corresponding to a "crystalline" material even if amorphous portions are contained regionally. In addition to the amorphous or crystalline silicon, a semiconductor material containing at least 50 atom % silicon such as amorphous silicon germanium also is considered as the "silicon-based" material.

EXAMPLE

The present invention is described further in detail using examples as follows, but is not limited by the following examples.

In the following examples and comparative examples, thin films were stacked on a glass ribbon surface using a plurality of coaters by the CVD method as described above. In depositing the films, a mixed gas containing 98 vol. % nitrogen and 2 vol. % hydrogen was supplied inside a float bath, so that the pressure inside the bath was maintained to be slightly higher than that outside the bath. A soda-lime glass material melted in a furnace was introduced into the float bath, which then was formed into a glass ribbon with a thickness of 4 mm. The glass ribbon, on the top surface of which predetermined thin films had been stacked, was annealed in an annealing furnace and then was washed, dried, and cut. A specific film deposition method is described as follows.

Example 1

The surface temperature of a glass ribbon directly before reaching a coater positioned on the furthest upstream side was set to be 750° C. From the coater on the furthest upstream side, a mixed gas containing dimethyltin dichloride (DMT) (vapor), oxygen, helium, and nitrogen was supplied. Then, from a coater on the downstream side, a mixed gas containing monosilane, ethylene, oxygen, and nitrogen was supplied. Subsequently, from a coater on the further downstream side, a mixed gas containing dimethyltin dichloride (vapor), oxygen, water vapor, nitrogen, and hydrogen fluoride was supplied. Thus, a tin oxide film with a thickness of about 30 nm, a silicon oxide film with a thickness of about 30 nm, and a fluorine-containing tin oxide film with a thickness of about 700 nm were stacked on the top surface of the glass ribbon in this order, thus obtaining a sample. In addition, a material gas was supplied only from the coater on the furthest upstream side to form a tin oxide film with a thickness of about 30 nm on the top surface of a glass ribbon, thus obtaining another sample.

Example 2

Samples were obtained by the same methods as in Example 1 except that the surface temperature of a glass ribbon directly before reaching a coater positioned on-the furthest upstream side was set to be 700° C.

Example 3

Samples were obtained by the same methods as in Example 1 except that the surface temperature of a glass ribbon directly before reaching a coater positioned on the furthest upstream side was set to be 650° C.

Example 4

The surface temperature of a glass ribbon directly before reaching a coater positioned on the furthest upstream side was set to be 650° C. From the coater on the furthest upstream side, a mixed gas containing monobutyltin trichloride (MBTC) (vapor), oxygen, helium, and nitrogen was supplied. Then, from a coater on the downstream side, a mixed gas containing monosilane, ethylene, oxygen, and nitrogen was supplied. Subsequently, from a coater on the further downstream side, a mixed gas containing monobutyltin trichloride (vapor), oxygen, water vapor, nitrogen, and trifluoroacetic acid was supplied. Thus, a tin oxide film with a thickness of about 30 nm, a silicon oxide film with a thickness of about 30 nm, and a fluorine-containing tin oxide film with a thickness of about 700 nm were stacked on the top surface of the glass ribbon in this order, thus obtaining a sample. In addition, a material gas was supplied only from the coater on the furthest upstream side to form a tin oxide film with a thickness of about 30 nm on the top surface of a glass ribbon, thus obtaining another sample.

Example 5

A soda-lime glass sheet with a thickness of 1.1 mm and a size of 100 mm×100 mm was washed and then was dried. This glass sheet was heated to 600° C. On its top surface, a mixed gas containing monobutyltin trichloride (vapor), oxygen, and nitrogen was supplied. Then, a mixed gas containing monosilane, oxygen, and nitrogen was supplied. Further, a mixed gas containing monobutyltin trichloride (vapor), oxygen, water vapor, nitrogen, and trifluoroacetic acid was supplied. Thus, a tin oxide film with a thickness of about 30 nm, a silicon oxide film with a thickness of about 30 nm, and a fluorine-containing tin oxide film with a thickness of about 700 nm were stacked on the top surface of the glass sheet in this order, thus obtaining a sample. In addition, another sample in which only a tin oxide film with a thickness of about 30 nm was formed also was obtained.

Example 6

The surface temperature of a glass ribbon directly before reaching a coater positioned on the furthest upstream side was set to be 700° C. From the coater on the furthest upstream side, a mixed gas containing dimethyltin dichloride (DMT) (vapor), oxygen, helium, nitrogen, and water vapor was supplied. Then, from a coater on the downstream side, a mixed gas containing monosilane, ethylene, oxygen, and nitrogen was supplied. In this case, the rate of ethylene content was increased to introduce carbon into the film. Subsequently, from a coater on the further downstream side, a mixed gas containing monobutyltin trichloride (vapor), oxygen, water vapor, nitrogen, helium, and trifluoroacetic acid was supplied. Thus, a tin oxide film with a thickness of about 45 nm, a silicon oxycarbide (SiOC) film with a thickness of about 15 nm, and a fluorine-containing tin oxide film with a thickness of about 700 nm were stacked on the top surface of the glass ribbon in this order, thus obtaining a sample. In addition, a material gas was supplied only from the coater on the farthest upstream side to form a tin oxide film with a thickness of about 45 nm on the top surface of a glass ribbon, thus obtaining another sample.

Example 7

The surface temperature of a glass ribbon directly before reaching a coater positioned on the furthest upstream side was set to be 680° C. From the coater on the furthest upstream side, a mixed gas containing monobutyltin trichloride (MBTC) (vapor), oxygen, helium, nitrogen, and water vapor was supplied. Then, from a coater on the downstream side, a mixed gas containing tetraethoxysilane, oxygen, nitrogen, and monobutyltin trichloride (vapor) was supplied. Subsequently, from a coater on the further downstream side, a mixed gas containing dimethyltin dichloride (vapor), oxygen, water vapor, nitrogen, and trifluoroacetic acid was supplied. Thus, a tin oxide film with a thickness of about 45 nm, a silicon tin oxide film (SiSnO) with a thickness of about 15 nm, and a fluorine-containing tin oxide film with a thickness of about 700 nm were stacked on the top surface of the glass ribbon in this order, thus obtaining a sample. In addition, a material gas was supplied only from the coater on the furthest upstream side to form a tin oxide film with a thickness of about 45 nm on the top surface of a glass ribbon, thus obtaining another sample.

Comparative Example 1

The surface temperature of a glass ribbon directly before reaching a coater positioned on the furthest upstream side was set to be 750° C. From the coater from which the gas containing monosilane was supplied in Example 1, a mixed gas containing monosilane, ethylene, oxygen, and nitrogen was supplied. Then, from the coater from which the gas containing dimethyltin dichloride was supplied in Example 1, a mixed gas. containing dimethyltin dichloride (vapor), oxygen, water vapor, nitrogen, and hydrogen fluoride was supplied. Thus, a silicon oxide film with a thickness of about 30 nm and a fluorine-containing tin oxide film with a thickness of about 700 nm were stacked on the top surface of the glass ribbon in this order, thus obtaining a sample. In addition, a material gas was supplied only from the first coater to form a silicon oxide film with a thickness of about 30 nm on the top surface of a glass ribbon, thus obtaining another sample.

Comparative Example 2

Samples were obtained by the same methods as in Comparative Example 1 except that the surface temperature of a glass ribbon directly before reaching a coater positioned on the furthest upstream side was set to be 650° C.

Comparative Example 3

Samples were obtained by the same methods as in Example 5 except that the heating temperature of a glass sheet was set to be 500° C.

From the samples obtained according to the examples and comparative examples described above, the samples in which only a tin oxide film or a silicon oxide film had been formed on a glass ribbon surface were observed by using a transmission electron microscope to measure the number of holes per square micron (hole density) and a mean diameter of the holes. Haze ratios of the samples in which a fluorine-containing tin oxide film had been formed on an undercoating film (a tin oxide film, a silicon oxide film) were measured according to the haze value measurement method (JIS K7105-1981). The haze ratios were measured with respect to incident light entering from the glass sheet side. Table 1 shows the results together with the kind and deposition conditions of the (first) undercoating film in contact with the glass sheet.

Example 8

On the conductive film of the glass sheet with a conductive film according to Example 2, an amorphous silicon photovoltaic unit was formed by the plasma CVD method, thus obtaining a thin film photoelectric conversion device. In the pin junction included in the amorphous silicon photovoltaic unit, a p-type amorphous silicon carbide layer and an n-type amorphous silicon layer were used and had thicknesses of 15 nm and 30 nm, respectively. An intrinsic amorphous silicon layer (i-type) was formed by a RF plasma CVD method. As film deposition conditions, a reaction gas of silane, a pressure inside a reaction chamber of about 40 Pa, a RF power density of 15 mW/cm$^2$, and a film deposition temperature of 150° C. were used. An intrinsic amorphous silicon film deposited directly on a glass substrate to have a thickness of 300 nm under the same film deposition conditions as those described above had a dark conductivity of $5 \times 10^{-10}$ S/cm. The thickness of the intrinsic amorphous silicon layer was set to be 300 nm. Finally, as a back electrode, an ITO film with a thickness of 80 nm and all Ag film with a thickness of 300 nm were deposited on the amorphous silicon photovoltaic unit in this order by sputtering.

The output characteristics of the thin film photoelectric conversion device (with a photovoltaic area of 1 cm$^2$) thus produced were measured while light of AM1.5 (100 mW/cm$^2$) was irradiated as incident light. The results included an open circuit voltage of 0.89V, a short-circuit current density of 16.2 mW/cm$^2$, a fill factor of 70.6%, and a conversion efficiency of 10.2%. Further, an optical degradation test was carried out by irradiating light of AM1.5 (100 mW/cm$^2$) at 48° C. After 550 hours irradiation, the conversion efficiency was degraded up to 8.4%.

As described above, according to the present invention, a substrate for a photoelectric conversion device with a higher haze ratio than that in a conventional one can be obtained. This substrate is provided with roughness, which contribute to the light trapping effect in the photoelectric conversion device, at the surface of the conductive film without an after-treatment. This substrate for a photoelectric conversion device is suitable for industrial mass-production.

Recently, since as can be seen particularly in an amorphous silicon-based thin film photoelectric conversion device, defect levels are formed in a photovoltaic layer by

TABLE 1

| | Holes | | | Undercoating Film in contact with Glass | | |
|---|---|---|---|---|---|---|
| | | | | Film | | |
| | Density (holes/$\mu m^2$) | Mean Diameter ($\mu m$) | Haze Ratio (%) | Type of Film | Deposition Temperature (° C.) | Tin Material |
| Example 1 | 2 | 0.2 | 9.5 | Tin Oxide | 750 | DMT |
| Example 2 | 4 | 0.2 | 11.2 | Tin Oxide | 700 | DMT |
| Example 3 | 5 | 0.1 | 9.8 | Tin Oxide | 650 | DMT |
| Example 4 | 6 | 0.1 | 10.3 | Tin Oxide | 650 | MBTC |
| Example 5 | 10 | 0.05 | 7.5 | Tin Oxide | 600 | MBTC |
| Example 6 | 5 | 0.1 | 10.2 | Tin Oxide | 700 | DMT |
| Example 7 | 6 | 0.1 | 10.1 | Tin Oxide | 680 | MBTC |
| Comparative Example 1 | 0 | — | 6.5 | Silicon Oxide | 750 | — |
| Comparative Example 2 | 0 | — | 5.5 | Silicon Oxide | 650 | — |
| Comparative Example 3 | 0 | — | 6.5 | Tin Oxide | 500 | MBTC |

As shown in Table 1, in the present examples, when the number of holes in a tin oxide film is 2 to 6 holes per square micron and the mean diameter of the holes is in the range between about 0.1 to 0.2 $\mu m$, a particularly high haze ratio was obtained.

light irradiation to deteriorate the photoelectric conversion characteristics, the thickness of the photovoltaic layer tends to be reduced. Therefore, in order to compensate the decrease in light absorption, a higher light trapping effect has been required. From such a viewpoint, the photoelectric conversion device of the present invention using the above-mentioned substrate is useful for improving the photoelectric conversion characteristics compared to those in a conventional one.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A substrate for a photoelectric conversion device, comprising:

a glass sheet containing an alkaline component;

a first undercoating film containing, as a main component, at least one selected from tin oxide, titanium oxide, indium oxide, and zinc oxide;

a second undercoating film; and a conductive film;

wherein the first undercoating film is a bottom layer, the second undercoating film is a middle layer, and the conductive film is a top layer, the films being formed on the glass sheet in this order, and holes are formed in the first undercoating film.

2. The substrate for a photoelectric conversion device according to claim 1, wherein the first undercoating film has at least two holes per square micron.

3. The substrate for a photoelectric conversion device according to claim 2, wherein the first undercoating film has 8 holes per square micron or less.

4. The substrate for a photoelectric conversion device according to claim 1, wherein the first undercoating film has a thickness in a range between 10 nm and 100 nm.

5. The substrate for a photoelectric conversion device according to claim 1, wherein the glass sheet is a float glass sheet obtained by a float glass process, and on a top surface of the float glass sheet, the first undercoating film, the second undercoating film, and the conductive film are formed.

6. A method of manufacturing a substrate for a photoelectric conversion device, comprising forming a first undercoating film as a bottom layer, a second undercoating film as a middle layer, and a conductive film as a top layer in this order on a glass sheet containing an alkaline component or on a glass ribbon in a manufacturing process of the glass sheet, wherein the first undercoating film is formed by a thermal decomposition oxidation reaction of a film forming material for the first undercoating film that contains chlorine on the glass sheet or the glass ribbon having a temperature of at least 600° C., whereby the first undercoating film includes holes.

7. A photoelectric conversion device, comprising:

the substrate for a photoelectric conversion device according to claim 1;

at least one photoelectric conversion unit; and a back electrode;

wherein the at least one photoelectric conversion unit and the back electrode are stacked with the photoelectric conversion unit adjacent the conductive film of the substrate.

8. A photoelectric conversion device, comprising:

the substrate for a photoelectric conversion device obtained by the method according to claim 6;

at least one photoelectric conversion unit; and a back electrode;

wherein the at least one photoelectric conversion unit and the back electrode are stacked with the photoelectric conversion unit adjacent the conductive film of the substrate.

9. The substrate for a photoelectric conversion device according to claim 1, wherein the holes are through holes.

10. The substrate for a photoelectric conversion device according to claim 1, wherein the conductive film contains tin oxide as a main component.

11. The method according to claim 6, wherein the holes are through holes.

12. The method according to claim 6, wherein the conductive film contains tin oxide as a main component.

* * * * *